(12) United States Patent
Zheng et al.

(10) Patent No.: US 10,356,929 B1
(45) Date of Patent: Jul. 16, 2019

(54) HARDWARE ADAPTER DEVICE

(71) Applicant: Honeywell International Inc., Morris Plains, NJ (US)

(72) Inventors: Yi Zheng, Beijing (CN); Xiaohui Qin, Shanghai (CN); Xinyan Zheng, Beijing (CN); Li Chen, Beijing (CN); Qingyong Zhang, Beijing (CN); Qian Liu, Beijing (CN); Cary Leen, Hammond, WI (US); Roy Kolasa, Kansas City, MO (US); Andrew Halford, Manchester, MD (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/958,600

(22) Filed: Apr. 20, 2018

(51) Int. Cl.
H05K 7/14 (2006.01)
H02G 3/16 (2006.01)
H01R 13/66 (2006.01)
H01R 31/06 (2006.01)
H01R 12/72 (2011.01)

(52) U.S. Cl.
CPC ........... *H05K 7/1468* (2013.01); *H01R 12/72* (2013.01); *H01R 13/6658* (2013.01); *H01R 31/065* (2013.01); *H02G 3/16* (2013.01); *H05K 7/1427* (2013.01); *H05K 7/1475* (2013.01)

(58) Field of Classification Search
CPC .. H05K 7/1468; H05K 7/1475; H05K 7/1427; H02G 3/16; H01R 31/065; H01R 13/6658; H01R 12/72
See application file for complete search history.

(56) References Cited

U.S. PATENT DOCUMENTS

| 4,152,750 A | 5/1979 | Bremenour et al. |
| 7,230,833 B1* | 6/2007 | Sickels ............... B60R 16/0239 |
| | | 361/740 |
| 7,440,293 B2* | 10/2008 | Hood, III ................ G06F 1/184 |
| | | 361/807 |
| 9,966,714 B1* | 5/2018 | Sreedharan .......... H01R 9/2675 |
| 2012/0106058 A1* | 5/2012 | Chin ..................... H05K 7/1467 |
| | | 361/679.4 |
| 2014/0211434 A1 | 7/2014 | Fry |
| 2017/0374756 A1 | 12/2017 | Leen et al. |
| 2018/0092235 A1* | 3/2018 | Mielnik ............... H05K 7/1474 |

FOREIGN PATENT DOCUMENTS

KR 20150113058 A 10/2015

OTHER PUBLICATIONS

"L Series space module", http://www.mitsubishielectric.com/fa/products/cnt/plca/pmerit/renewal/case/l_spaceunit.html, Nov. 15, 2017, 2 pages.
"Melsecnet/Mini-S3 I/O modules wiring conversion adapter", http://www.mitsubishielectric.com/fa/products/cnt/plca/pmerit/renewal/case/a_mini_s3.html, Nov. 15, 2017, 2 pages.

* cited by examiner

*Primary Examiner* — Abhishek M Rathod
(74) *Attorney, Agent, or Firm* — Honeywell International Inc.

(57) ABSTRACT

Methods, devices, and systems for a hardware adapter device are described herein. One device includes housing, a plurality of printed circuit boards (PCBs) housed by the housing, where each of the plurality of PCBs include traces, and a switch to select a bus address corresponding to the hardware adapter device, where the housing receives an input/output (I/O) module such that the traces of the PCBs provide an electrical path from a wiring baseboard to the I/O module.

16 Claims, 6 Drawing Sheets

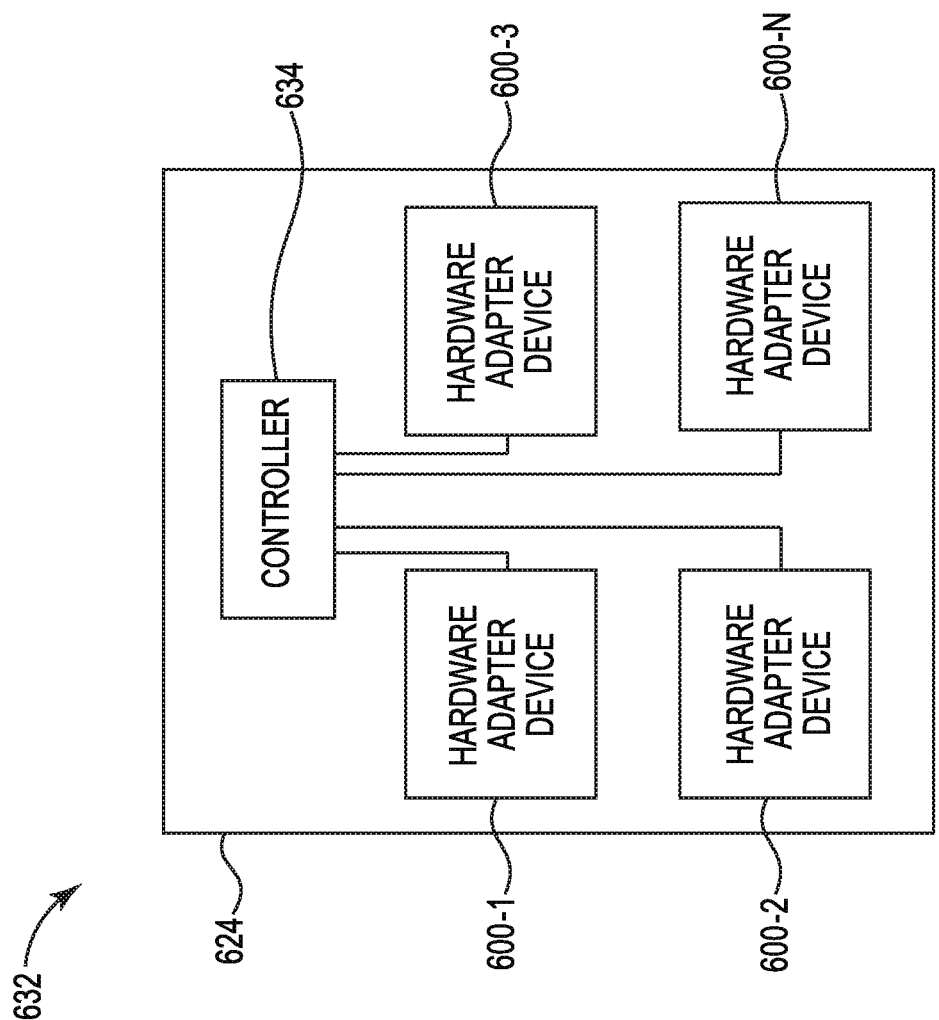

US 10,356,929 B1

HARDWARE ADAPTER DEVICE

TECHNICAL FIELD

The present disclosure relates to methods, devices, and systems for a hardware adapter device.

BACKGROUND

Control systems in a building may be utilized by a building automation system in order to control systems in the building. For example, centralized control of a heating, ventilation, and air-conditioning (HVAC) system of a building may be realized by a building automation system.

A building automation system can utilize controllers to control systems, such as HVAC systems, in a building. Controllers can utilize different inputs to determine information about devices included in a building automation system. For example, a building controller can utilize inputs such as temperature, pressure, and/or humidity, among other inputs, to determine information about equipment in a building's HVAC system, such as the status of a boiler.

Controllers can output various signals to devices included in a building automation system. For example, a controller can output a signal to a boiler to increase a supply water temperature output from the boiler.

The inputs and outputs of a controller can include different types of signals. For example, the types of signals may include an analog input/output signal, a binary input/output signal, and/or a digital input/output signal.

BRIEF DESCRIPTION OF THE DRAWINGS

FIG. 6 is a block diagram of a system, in accordance with embodiments of the present disclosure.

DETAILED DESCRIPTION

Figure 1:
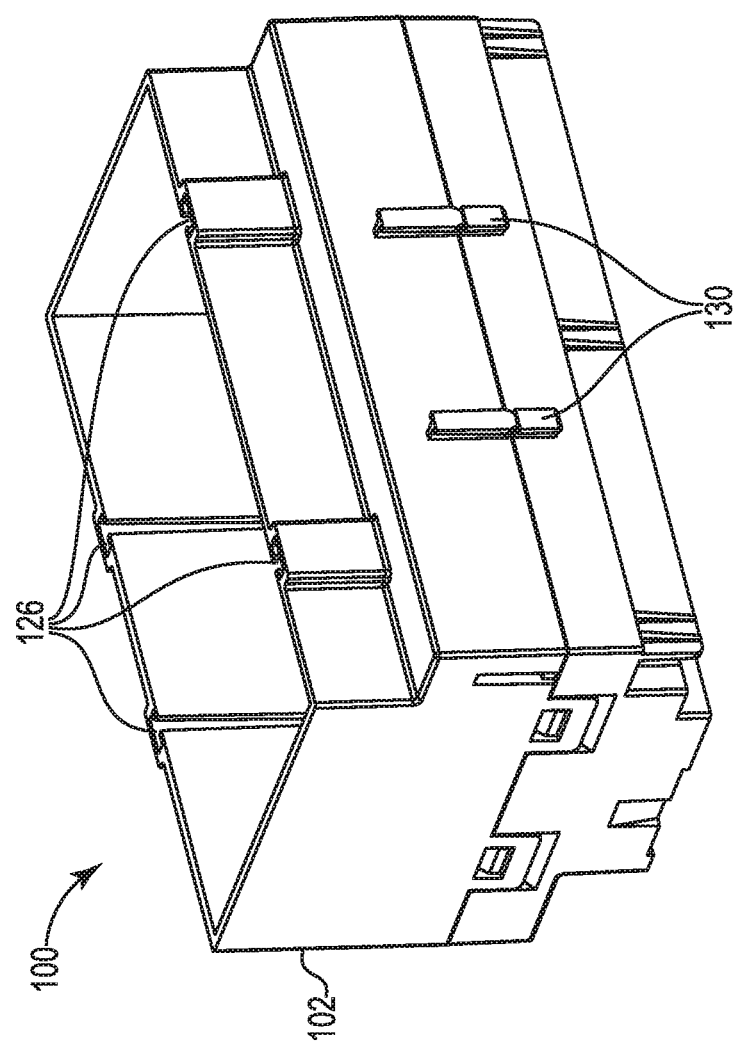
FIG. 1 is a perspective view of a hardware adapter device, in accordance with embodiments of the present disclosure.

Methods, devices, and systems for a hardware adapter device are described herein. One device includes housing, a plurality of printed circuit boards (PCBs) housed by the housing, where each of the plurality of PCBs include traces, and a switch to select a bus address corresponding to the hardware adapter device, where the housing receives an input/output (I/O) module such that the traces of the PCBs provide an electrical path from a wiring baseboard to the I/O module.

Controllers utilized in a building automation system can allow for efficient operation of building systems. Further, the controllers can, in some examples, reduce energy consumption and operating costs of various building systems.

Efficient operation of building systems can depend on the building controllers in use. For example, older building controllers may not work as well as newer, more efficient building controllers. However, incorporation of newer building controllers into existing building systems may be difficult, since newer controllers may not be wired correctly for use in older building automation systems.

Replacing older and/or less efficient building controllers can be arduous and lengthy. For example, wiring baseboards may need to be removed and connections rewired for use with a newer building controller. Rewiring baseboards can cause high labor costs as well as significant downtime to a consumer, such as a building owner or operator, during a changeover from older to newer building controllers.

Embodiments of the present disclosure can allow for replacement of older and/or less efficient building controllers without the need to remove and/or rewire connections of a wiring baseboard. By avoiding the need to remove and/or rewire the wiring baseboard, older and/or less efficient building controllers can be replaced more quickly, reducing consumer downtime and cost.

In the following detailed description, reference is made to the accompanying drawings that form a part hereof. The drawings show by way of illustration how embodiments of the disclosure may be practiced.

These embodiments are described in sufficient detail to enable those of ordinary skill in the art to practice embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing.

FIG. 1 is a perspective view of a hardware adapter device 100, in accordance with embodiments of the present disclosure. As illustrated in FIG. 1, hardware adapter device 100 can include a housing 102. Housing 102 can include channels 126 and protrusions 130.

Although not illustrated in FIG. 1 for clarity and so as not to obscure embodiments of the present disclosure, housing 102 can include a plurality of printed circuit boards (PCBs), as further described in connection with FIGS. 3 and 4. As used herein, the term "PCB" can, for example, refer to a board that mechanically supports and electrically connects electrical components using conductive tracks (e.g., traces), pads, and/or other methods of electrical connection. The traces can, for example, be etched from sheets of material laminated onto a substrate.

Housing 102 can be of a plastic material. For instance, in some examples, housing 102 may be formed of a thermoplastic polymer resin. Examples of suitable thermoplastic polymer resins may include ultra-low density polyethylene, very low density polyethylene ("VLDPE"), linear low density polyethylene ("LLDPE"), low density polyethylene ("LDPE"), medium density polyethylene ("MDPE"), high density polyethylene ("HDPE"), polypropylene, isotactic polypropylene, highly isotactic polypropylene, syndiotactic polypropylene, random copolymer of propylene and ethylene and/or butene and/or hexene, elastomers such as ethylene propylene rubber, ethylene propylene diene monomer rubber, neoprene, and blends of thermoplastic polymers and elastomers, such as for example, thermoplastic elastomers and rubber toughened plastics. In some examples, housing 102 may be formed of polyethylene terephthalate (PET). However, examples of the disclosure are not limited to the above described materials. For example, housing 102 may be formed of any other type of material.

Although not illustrated in FIG. 1 for clarity and so as not to obscure examples of the present disclosure, housing 102 can include a switch. The switch can select a bus address corresponding to hardware adapter device 100, as is further described in connection with FIGS. 2 and 6.

Housing 102 can receive an input/output (I/O) module. As used herein, the term "I/O" module can, for example, refer to a device which controls a data exchange between other devices. For example, the I/O module can receive a data input from one device, modify the data input, and output the modified data input to another device. For instance, the I/O module can receive an input (e.g., an analog, binary, and/or digital input) and generate an output (e.g., an analog, binary, and/or digital output).

Housing 102 can receive a new I/O module. For example, the plurality of PCBs included in housing 102 can be coupled to an existing wiring baseboard such that the plurality of PCBs can provide an electrical path from the existing wiring baseboard to the new I/O module, as is further described in connection with FIG. 5. In other words, housing 102 can be utilized to replace an old I/O module connected to an existing wiring baseboard, and enable the use of a new I/O module with the existing wiring baseboard.

Housing 102 can include channels 126. As used herein, the term "channel" can, for example, refer to a groove in a piece of material. For example, housing 102 can include grooves on an inner surface of the material of housing 102.

As illustrated in FIG. 1, channels 126 can be shaped in a "T" shape. However, embodiments of the present disclosure are not limited to T-shaped channels 126. For example, channels 126 can be any other shaped channels.

As illustrated in FIG. 1, housing 102 can include four channels 126. However, embodiments of the present disclosure are not limited to four channels 126. For example, housing 102 can include less than four channels, or more than four channels.

Channels 126 can be shaped to receive protrusions included in the new I/O module that can be received by housing 102. For example, the protrusions included on the I/O module can be similarly T-shaped such that the protrusions fit into the T-shaped channels 126 of housing 102. The channels 126 can align connection pins of the I/O module with receiving terminals of a PCB of the plurality of PCBs housed by housing 102, as is further described in connection with FIGS. 3-5.

As illustrated in FIG. 1, housing 102 can include a plurality of protrusions 130 on an outer surface of the material of housing 102. The protrusions 130 can be T-shaped. The T-shaped protrusions of housing 102 can be shaped to fit in channels included in the existing wiring baseboard, as is further described in connection with FIG. 5.

Figure 2:
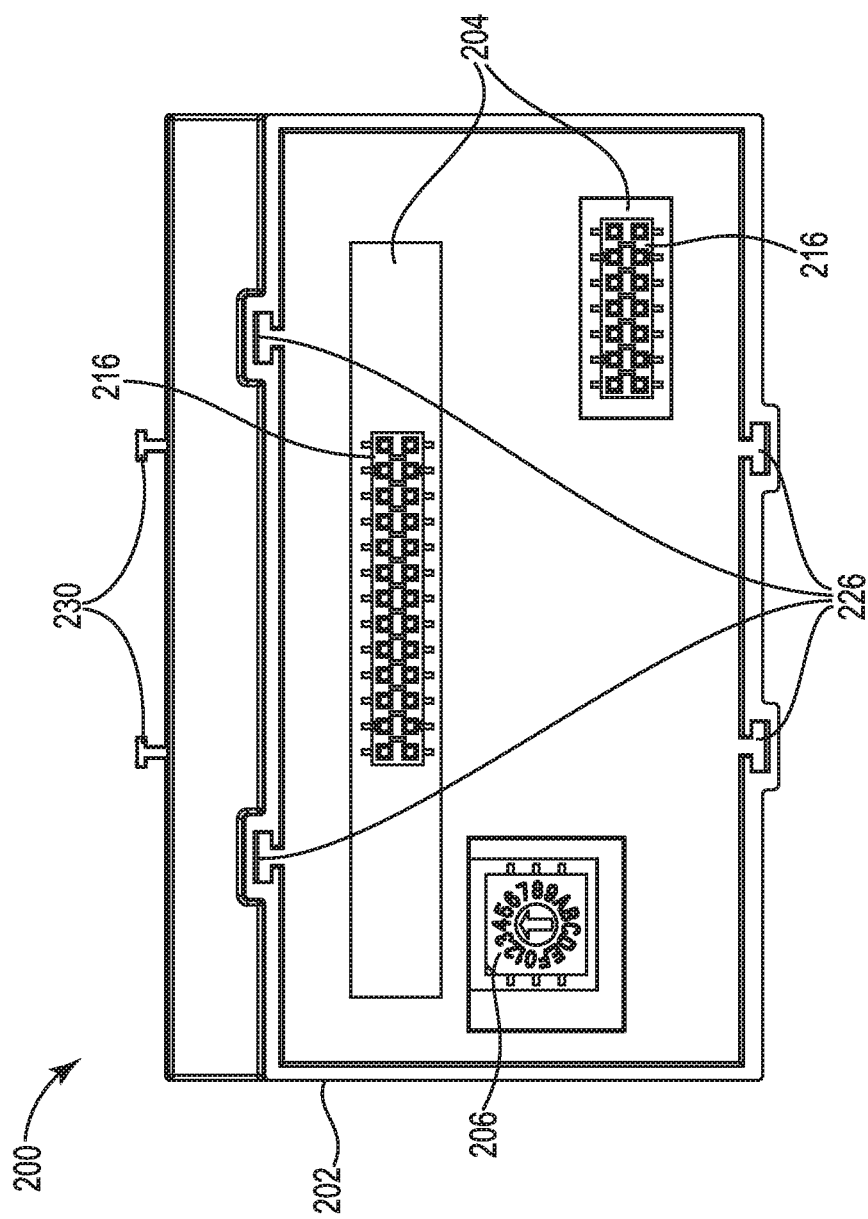
FIG. 2 is a top view of a hardware adapter device, in accordance with embodiments of the present disclosure.

FIG. 2 is a top view of a hardware adapter device 200, in accordance with embodiments of the present disclosure. As illustrated in FIG. 2, hardware adapter device 200 can include housing 202, plurality of PCBs 204, rotary switch 206, channels 226, and protrusions 230. The plurality of PCBs 204 can include receiving terminals 216.

As described above, hardware adapter device 200 can include housing 202. Housing 202 can house a plurality of PCBs. In some examples, a particular PCB can include receiving terminals 216. As used herein, the term "receiving terminal" can, for example, refer to female pin headers to receive connection pins. For example, receiving terminals 216 can receive connection pins from an I/O module. The receiving terminals 216 can receive the connection pins from the I/O module such that the particular PCB including receiving terminals 216 can be electrically connected to the I/O module.

As described in connection with FIG. 1, housing 202 can receive the I/O module. The housing 202 can receive the I/O module such that the I/O module is secured within housing 202. For example, in the orientation illustrated in FIG. 2, the housing 202 can receive the I/O module as the I/O module is moved "into" the page towards housing 202.

As previously described in connection with FIG. 1, housing 202 can include channels 226 to receive protrusions on the I/O module. Channels 226 can be T-shaped channels. Channels 226 can receive the correspondingly shaped protrusions on the I/O module such that channels 226 can align connection pins on the I/O module with receiving terminals 216 of the particular PCB of the plurality of PCBs 204 housed by housing 202. Once seated in housing 202, connection pins of the I/O module can be coupled to receiving terminals 216, electrically connecting the I/O module to the plurality of PCBs 204.

As previously described in connection with FIG. 1, housing 202 can include protrusions 230. The protrusions 230 can be on an outer surface of housing 202 and can be T-shaped. As hardware adapter device 200 is connected to the existing wiring baseboard, protrusions 230 can fit into correspondingly shaped channels included in the existing wiring baseboard such that connection pins of the plurality of PCBs 204 align with receiving terminals of the existing wiring baseboard, as is further described in connection with FIG. 5.

Housing 202 can include switch 206. Switch 206 can be a rotary switch. As used herein, the term "rotary switch" can, for example, refer to a switch operated by rotation. Rotary switch 206 can determine a bus address of hardware adapter device 200, as is further described in connection with FIG. 6.

Figure 3:
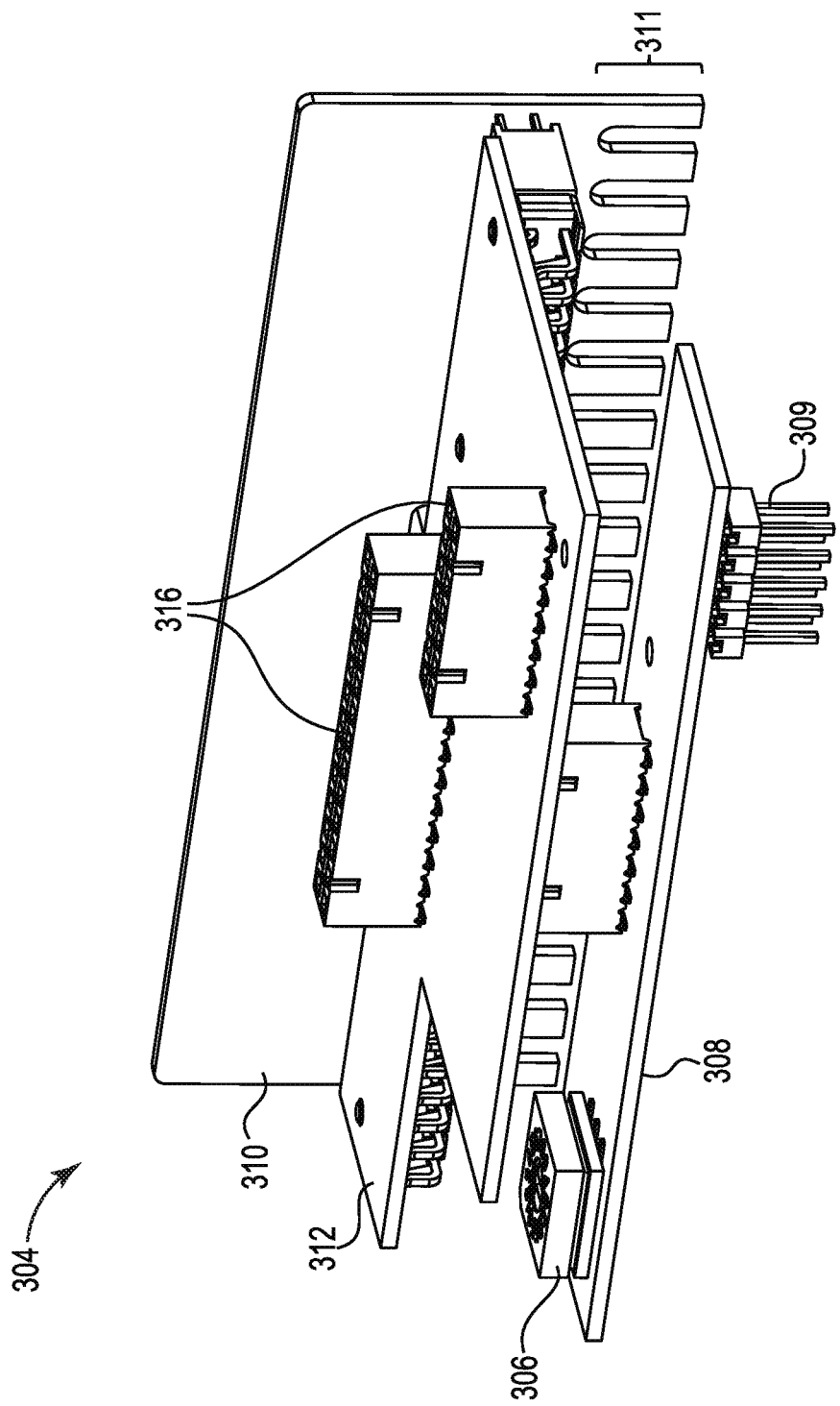
FIG. 3 is a perspective view of printed circuit boards (PCBs) of a hardware adapter device, in accordance with embodiments of the present disclosure.

FIG. 3 is a perspective view of PCBs 304 of a hardware adapter device, in accordance with embodiments of the present disclosure. As illustrated in FIG. 3, the plurality of PCBs 304 can include a first PCB 308, a second PCB 310 and a third PCB 312.

First PCB 308 can be housed by a housing (e.g., housing 102, 202, previously described in connection with FIGS. 1 and 2). First PCB 308 can be electrically connected to third PCB 312.

First PCB 308 can include a plurality of connection pins 309. The plurality of connection pins 309 can be received by receiving terminals of a wiring baseboard. For example, the plurality of connection pins of first PCB 308 can be inserted into receiving terminals of a wiring baseboard.

The first PCB 308 can be electrically connected to the wiring baseboard via the plurality of connection pins 309 of first PCB 308. For example, based on the connection pins 309 being coupled with the receiving terminals of the wiring baseboard, first PCB 308 can be electrically connected to the wiring baseboard.

Second PCB 310 can be housed by a housing (e.g., housing 102, 202, previously described in connection with FIGS. 1 and 2). Second PCB 310 can be electrically connected to a first PCB (e.g., first PCB 408, as is described in connection with FIG. 4).

As illustrated in FIG. 3, second PCB 310 can include a plurality of connection pins 311. Connection pins 311 can be received by receiving terminals of a wiring baseboard. For example, connection pins 311 can be inserted into receiving terminals of a wiring baseboard.

The second PCB 310 can be electrically connected to the wiring baseboard via the connection pins 311. For example, based on the connection pins 311 being coupled with the receiving terminals of the wiring baseboard, second PCB 310 can be electrically connected to the wiring baseboard.

Third PCB 312 can be housed by a housing (e.g., housing 102, 202, previously described in connection with FIGS. 1 and 2). Third PCB 312 can be electrically connected to a first PCB (e.g., first PCB 408, as is described in connection with FIG. 4) and second PCB 310. In some examples, the first PCB and second PCB 310 can include connection pins, and third PCB 312 can include receiving terminals such that the first PCB and second PCB 310 can be electrically connected via the connection pins of the first PCB and second PCB 310 and the receiving terminals of third PCB 312. However, embodiments of the present disclosure are not so limited. For instance, in some examples, the first PCB and second PCB 310 can include receiving terminals, and third PCB 312 can include connection pins such that the first PCB and second PCB 310 can be electrically connected via the receiving terminals of the first PCB and second PCB 310 and the connection pins of third PCB 312, or combinations thereof.

As illustrated in FIG. 3, third PCB 312 can include receiving terminals 316. Receiving terminals 316 can couple to connection pins of an I/O module. For example, connection pins of the I/O module can be inserted into receiving terminals 316 of third PCB 312.

The third PCB 312 can be electrically connected to the I/O module via the connection pins of the I/O module (e.g., not shown in FIG. 3) and receiving terminals 316 of third PCB 312. For example, based on the connection pins of the I/O module being coupled with the receiving terminals 316 of third PCB 312, third PCB 312 can be electrically connected to the I/O module.

First PCB 308 and third PCB 312 can be oriented parallel to each other when housed by the housing of the hardware adapter device. However, embodiments of the present disclosure are not so limited. For example, first PCB 308 and third PCB 312 can be oriented in a substantially parallel orientation relative to each other when housed by the housing of the hardware adapter device.

As used herein, the term "substantially" intends that the characteristic does not have to be absolute, but is close enough so as to achieve the characteristic. For example, "substantially normal" is not limited to absolute normal. For example, "substantially parallel" is not limited to absolutely parallel.

As illustrated in FIG. 3, second PCB 310 can be oriented normal to third PCB 312. For example, second PCB 310 can be oriented perpendicularly with respect to third PCB 312. However, embodiments of the present disclosure are not so limited. For example, second PCB 310 can be oriented in a substantially normal orientation relative to third PCB 312.

Second PCB 310 can be oriented normal to first PCB 308. For example, second PCB 310 can be oriented perpendicularly with respect to first PCB 308 when housed by the housing of the hardware adapter device. However, embodiments of the present disclosure are not so limited. For example, second PCB 310 can be oriented in a substantially normal orientation relative to first PCB 308 when housed by the housing of the hardware adapter device.

Figure 4:
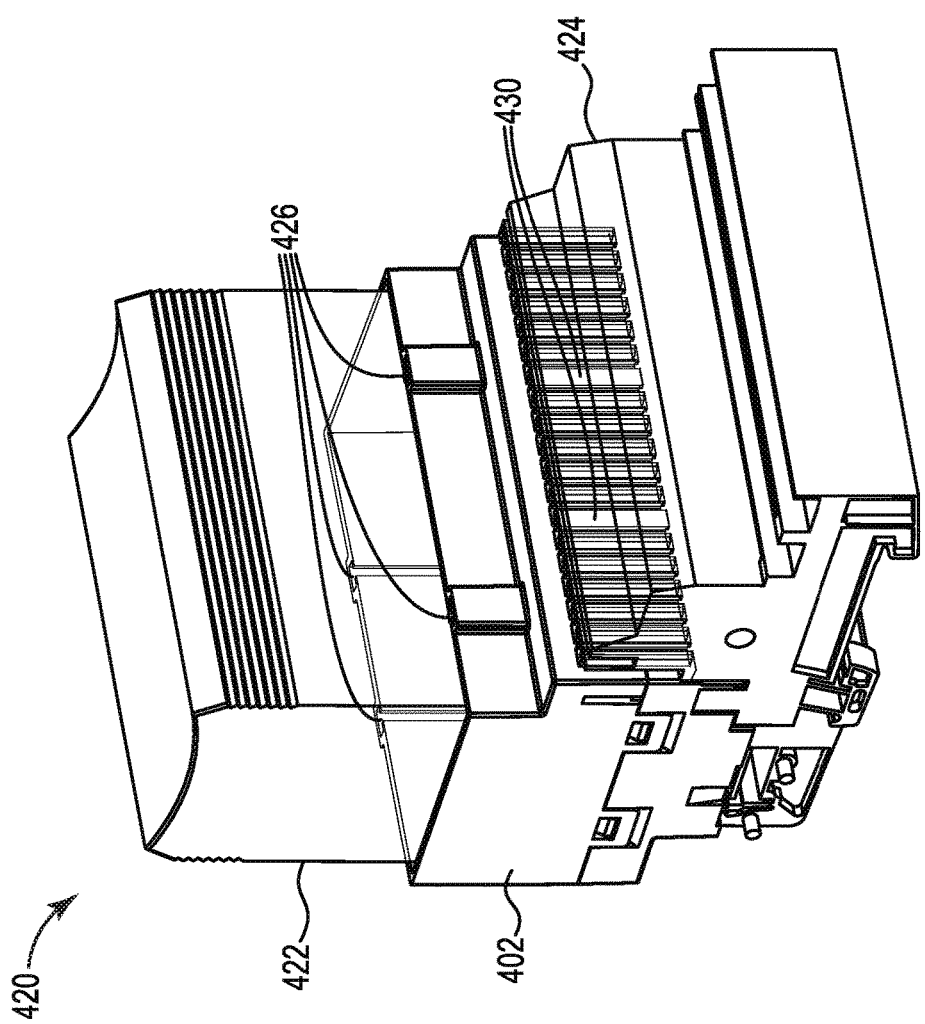
FIG. 4 is a perspective view of a system including a hardware adapter device, in accordance with embodiments of the present disclosure.

FIG. 4 a perspective view of a system 420 including a hardware adapter device, in accordance with embodiments of the present disclosure. As illustrated in FIG. 4, system 420 can include housing 402, I/O module 422, and wiring baseboard 424. Housing 402 can include channels 426 and protrusions 430.

As illustrated in FIG. 4, the hardware adapter device can be included as part of a hardware adapter system. Housing 402 can be coupled to wiring baseboard 424 and can include I/O module 422. The hardware adapter system can be utilized to replace old I/O modules with new I/O modules (e.g., I/O module 422) without rewiring wiring baseboard 424, as is further described herein.

As previously described in connection with FIGS. 1-3, the hardware adapter device can include housing 402. Housing 402 can house a first PCB (e.g., PCB 308, previously described in connection with FIG. 3), a second PCB (e.g., second PCB 310, previously described in connection with FIG. 3), and a third PCB (e.g., PCB 312, previously described in connection with FIG. 3).

The first PCB can include connection pins. The connection pins of the first PCB can be coupled to receiving terminals of wiring baseboard 424. The connection pins of the first PCB being coupled to receiving terminals of wiring baseboard 424 can allow for the first PCB to be electrically connected to wiring baseboard 424.

The second PCB can include connection pins. The connection pins of the second PCB can be coupled to receiving terminals of wiring baseboard 424. The connection pins of the second PCB can be coupled to receiving terminals that are different than the receiving terminals the first PCB is coupled to. The connection pins of the second PCB being coupled to receiving terminals of wiring baseboard 424 can allow for the second PCB to be electrically connected to wiring baseboard 424.

The third PCB can be electrically connected to the first PCB and the second PCB via a combination of connection pins and receiving terminals. The third PCB can include receiving terminals to couple to connection pins of I/O module 422. The receiving terminals being coupled to the connection pins of I/O module 422 can allow for the third PCB to be electrically connected to I/O module 422.

Based on the electrical connections of the first PCB, the second PCB, and the third PCB, an electrical connection can be made between wiring baseboard 424 and I/O module 422. For example, the first PCB, the second PCB, and the third PCB can include electrical traces such that an electrical connection is made between wiring baseboard 424 and I/O module 422.

The first PCB, the second PCB, and the third PCB can be used to migrate (e.g., upgrade, update, and/or replace) existing I/O modules connected to wiring baseboard 424 with new I/O modules (e.g., I/O module 422). For example, although not shown in FIG. 4 for clarity and so as not to obscure embodiments of the present disclosure, an existing I/O module can be removed from the wiring baseboard 424. The wiring baseboard 424 can be left intact (e.g., the wiring baseboard 424 is not removed and/or rewired).

An existing I/O module can be replaced using new I/O module 422 by using the hardware adapter device (e.g., hardware adapter device 100, 200, previously described in connection with FIGS. 1 and 2, respectively). The hardware adapter device can include the first PCB, second PCB, and third PCB that are housed by the housing 402 of the hardware adapter device to provide an electrical connection between I/O module 422 and wiring baseboard 424 such that an electric current can flow between I/O module 422 and wiring baseboard 424.

As previously described in connection with FIGS. 1 and 2, housing 402 can include channels 426. Channels 426 can be shaped to receive protrusions included on an outer surface of I/O module 422.

For example, channels 426 located on an inner surface of housing 402 can be T-shaped, and protrusions included on the outer surface of I/O module 422 can be correspondingly T-shaped. As a result, T-shaped channels 426 of housing 402 can receive T-shaped protrusions of I/O module 422 such that the T-shaped channels 426 align connection pins of I/O module 422 with receiving terminals of the third PCB included in housing 402. The channels 426 can ensure the connection pins of I/O module 422 are aligned with receiving terminals of the third PCB so that a user can easily connect I/O module 422 with the hardware adapter device.

As previously described in connection with FIGS. 1 and 2, housing 402 can include protrusions 430. Protrusions 430 can be included on an outer surface of housing 402.

For example, protrusions 430 located on the outer surface of housing 502 can be T-shaped, and channels located on wiring baseboard 524 can be correspondingly T-shaped. As a result, T-shaped protrusions 430 of housing 402 can fit in the T-shaped channels of wiring baseboard 424 such that the T-shaped protrusions 430 align connection pins of PCBs housed by housing 402 with receiving terminals of wiring baseboard 424. The protrusions 430 can ensure the connection pins of the PCBs located in housing 402 are aligned with the receiving terminals of wiring baseboard 424 so that a user can easily connect the hardware adapter device with wiring baseboard 424.

Figure 5B:
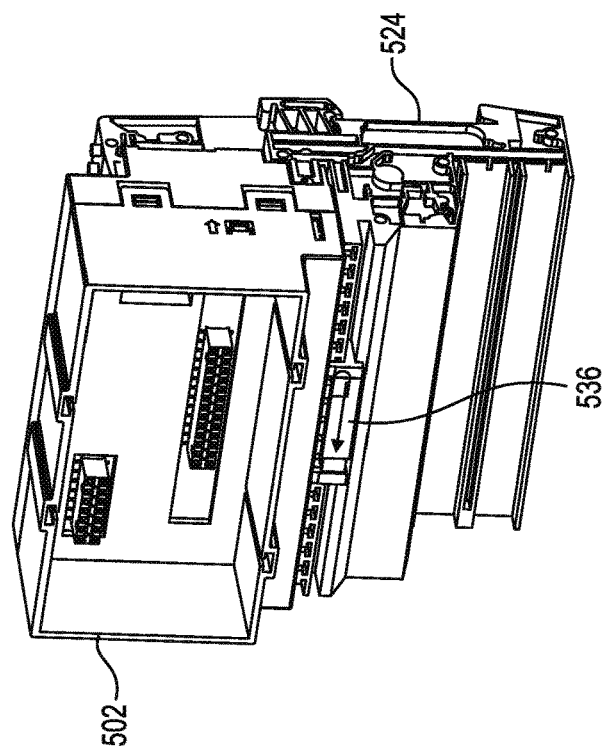
FIG. 5B is a perspective view of a system including a hardware adapter device and a locking mechanism in a locked position, in accordance with embodiments of the present disclosure
Figure 5A:
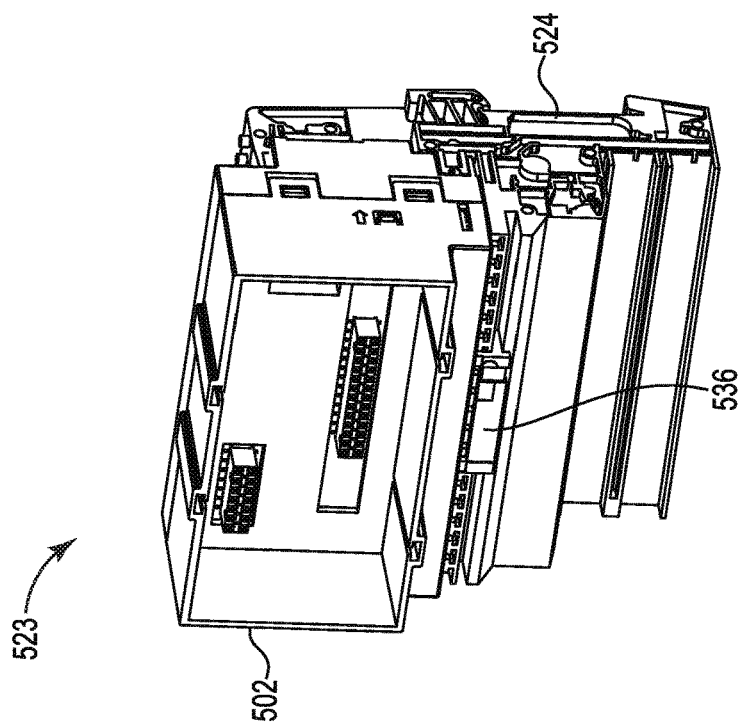
FIG. 5A is a perspective view of a system including a hardware adapter device and a locking mechanism in an unlocked position, in accordance with embodiments of the present disclosure.

FIG. 5A is a perspective view of a system 523 including a hardware adapter device and a locking mechanism in an unlocked position, in accordance with embodiments of the present disclosure. As illustrated in FIG. 5A, system 523 can include housing 502, wiring baseboard 524, and locking mechanism 536.

As illustrated in FIG. 5, wiring baseboard 524 can include a locking mechanism 536. For example, the locking mechanism 536 can secure the hardware adapter device 502 to wiring baseboard 524 when the first PCB and the second PCB are coupled to the wiring baseboard 524. For instance, when the connection pins of the first PCB and the second PCB are fully inserted into the receiving terminals of wiring baseboard 524, the T-shaped protrusions 530 can clear the locking mechanism 536. As illustrated in FIG. 5A, locking mechanism 536 is in an unlocked position.

FIG. 5B is a perspective view of a system 523 including a hardware adapter device and a locking mechanism in a locked position, in accordance with embodiments of the present disclosure. As illustrated in FIG. 5B, system 523 can include housing 502, wiring baseboard 524, and locking mechanism 536.

As previously described in connection with FIG. 5A, locking mechanism 536 can secure hardware adapter device 502 to wiring baseboard 524 when the first PCB and the second PCB are coupled to the wiring baseboard 524. As a result of the connection pins of the first PCB and the second PCB being fully inserted into the receiving terminals of wiring baseboard 524, the locking mechanism 536 of wiring baseboard 524 can be engaged. For example, the locking mechanism 536 can be moved in the direction indicated in FIG. 5B in order to engage locking mechanism 536 in order to lock hardware adapter device 502 to wiring baseboard 524.

The locking mechanism 536 of wiring baseboard 524 can serve to notify the user that the hardware adapter device is connected to wiring baseboard 524, as the locking mechanism 536 may not be able to be engaged if the connection pins of the first PCB and the second PCB are not fully inserted into the receiving terminals of wiring baseboard 524.

FIG. 6 is a block diagram of a system 632, in accordance with embodiments of the present disclosure. As illustrated in FIG. 6, the system 632 can include a wiring baseboard 624, controller 634, and hardware adapter devices 600-1, 600-2, 600-3, 600-N (referred to collectively herein as hardware adapter devices 600).

As previously described in connection with FIGS. 1-5, each of hardware adapter devices 600 can include a housing that houses a first PCB, a second PCB, and a third PCB. The first PCB can include connection pins. The connection pins of the first PCB can be coupled to receiving terminals of wiring baseboard 624. The connection pins of the first PCB being coupled to receiving terminals of wiring baseboard 624 can allow for the first PCB to be electrically connected to wiring baseboard 624.

The second PCB can include connection pins. The connection pins of the second PCB can be coupled to different receiving terminals of wiring baseboard 624 than that of the first PCB of each hardware adapter device 600. The connection pins of the second PCB being coupled to receiving terminals of wiring baseboard 624 can allow for the second PCB to be electrically connected to wiring baseboard 624.

The third PCB can be electrically connected to the first PCB and the second PCB via a combination of connection pins and receiving terminals. The third PCB can include receiving terminals to couple to connection pins of an I/O module. For example, each of the hardware adapter devices 600 can include an I/O module. The receiving terminals being coupled to the connection pins of the I/O module can allow for the third PCB to be electrically connected to the I/O module.

Based on the electrical connections of the first PCB, the second PCB, and the third PCB of each hardware adapter device 600, an electrical connection can be made between wiring baseboard 624 and the I/O module of each of the hardware adapter devices 600. For example, the first PCB, the second PCB, and the third PCB can include electrical traces such that an electrical connection is made between wiring baseboard 624 and the I/O modules of each of the hardware adapter devices 600.

Although not illustrated in FIG. 6 for clarity and so as not to obscure embodiments of the present disclosure, each hardware adapter device 600 can include a rotary switch. The rotary switch can determine a bus address of each hardware adapter device 600.

The bus address can be a unique bus address for that respective hardware adapter device 600. For example, the rotary switch of hardware adapter device 600-1 can determine a first bus address for hardware adapter device 600-1. Similarly, the rotary switch of hardware adapter device 600-2 can determine a second bus address for hardware adapter device 600-2, the rotary switch of hardware adapter device 600-3 can determine a third bus address for hardware adapter device 600-3, the rotary switch of hardware adapter device 600-N can determine an Nth bus address for hardware adapter device 600-N.

As illustrated in FIG. 6, system 632 can include controller 634. Controller 634 can include hardware and/or software for use in receiving signals from various devices included in a building automation system, as well as outputting various signals to the devices included in the building automation system. For instance, controller 634 can receive and/or transmit signals to devices included in the building automation system. For example, controller 634 can be used for monitoring and/or controlling devices included in electrical, plumbing, and/or HVAC systems of a building automation system, among other applications. For instance, hardware adapter devices 600 can communicate signals with controller 634 and wiring baseboard 624 for use in an HVAC control system of a building.

Controller 634 can communicate with each I/O module of each hardware adapter device 600 based on the unique defined bus address for each of the hardware adapter devices 600. For example, controller 634 can communicate with the I/O module of hardware adapter device 600-1 based on the unique bus address of hardware adapter device 600-1, determined by the rotary switch of hardware adapter device 600-1. Similarly, controller 634 can communicate with the I/O module of hardware adapter device 600-2 based on the unique bus address of hardware adapter device 600-2, determined by the rotary switch of hardware adapter device 600-2, communicate with the I/O module of hardware adapter device 600-3 based on the unique bus address of hardware adapter device 600-3, determined by the rotary switch of hardware adapter device 600-3, and can communicate with the I/O module of hardware adapter device 600-N based on the unique bus address of hardware adapter device 600-N, determined by the rotary switch of hardware adapter device 600-N.

A hardware adapter device can allow for the replacement of existing I/O modules on an existing wiring baseboard with newer technology, such as new and/or updated I/O modules and/or controllers. For example, hardware adapter devices 600 can connect to the wiring baseboard 624 to allow for the replacement of existing I/O modules and/or controllers with new I/O modules and/or controllers, by providing updated electrical connections via PCBs included in each hardware adapter device 600.

Providing the electrical connections needed to update existing I/O modules and/or controllers PCBs included in hardware adapter devices 600 can eliminate the need to remove and rewire connections of a wiring baseboard. By not having to remove and rewire connections, high labor costs and significant downtime during a changeover from older to newer I/O modules and/or controllers can be avoided.

Additionally, the PCBs being included in the housings of the hardware adapter devices 600 can allow for installation of upgraded equipment while maintaining the original footprint of the existing I/O modules and/or controllers being replaced, preventing the need to find additional space in the wiring baseboard 624. Further, no permanent modification of the existing wiring panel is required, allowing for the option to revert to older I/O modules and/or controllers.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. Similar elements or components between different figures may be identified by the use of similar digits. For example, 102 may reference element "02" in FIG. 1, and a similar element may be referenced as 202 in FIG. 2. As used herein, the designator "N", particularly with respect to reference numerals in the drawings, indicate that a plurality of the particular feature so designated can be included with examples of the disclosure.

This method of disclosure is not to be interpreted as reflecting an intention that the embodiments of the disclosure require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A hardware adapter system, comprising:
   a wiring baseboard;
   an input/output (I/O) module;
   a hardware adapter device, wherein the hardware adapter device includes:
      a first printed circuit board (PCB) housed by a housing of the hardware adapter device, wherein the first PCB includes a first plurality of connection pins coupled to a first plurality of receiving terminals of the wiring baseboard;
      a second PCB housed by the housing and electrically connected to the first PCB, wherein the second PCB includes a second plurality of connection pins coupled to a second plurality of receiving terminals of the wiring baseboard; and
      a third PCB housed by the housing and electrically connected to the first PCB and the second PCB, wherein the third PCB includes receiving terminals positioned within the housing and configured to couple to a plurality of connection pins of the I/O module when the I/O module is inserted into the housing; and
      a switch to select a bus address corresponding to the hardware adapter device.

2. The hardware adapter system of claim 1, wherein the housing includes a channel shaped to receive a protrusion included on the I/O module such that the channel aligns connection pins of the I/O module with receiving terminals of the third PCB.

3. The hardware adapter system of claim 1, wherein the first PCB is electrically connected to the wiring baseboard via the first plurality of connection pins of the first PCB and the first plurality of receiving terminals of the wiring baseboard.

4. The hardware adapter system of claim 1, wherein the second PCB is electrically connected to the wiring baseboard via the second plurality of connection pins of the second PCB and the second plurality of receiving terminals of the wiring baseboard.

5. The hardware adapter system of claim 1, wherein the third PCB is electrically connected to the I/O module via the receiving terminals of the third PCB and the plurality of connection pins of the I/O module.

6. The hardware adapter system of claim 1, wherein the first PCB and the third PCB are oriented parallel to each other in the housing of the hardware adapter device.

7. The hardware adapter system of claim 1, wherein the second PCB is oriented normal to the first PCB in the housing of the hardware adapter device.

8. The hardware adapter system of claim 1, wherein the second PCB is oriented normal to the third PCB in the housing of the hardware adapter device.

9. The hardware adapter system of claim 1, wherein the switch is a rotary switch.

10. The hardware adapter system of claim 1, wherein:
the housing of the hardware adapter device includes a plurality of channels on an inner surface of the housing;
the I/O module includes a plurality of protrusions; and
the plurality of protrusions of the I/O module fit in the plurality of channels on the inner surface of the housing such that the plurality of connection pins of the I/O module are aligned with the receiving terminals of the third PCB.

11. The hardware adapter system of claim 1, wherein:
the housing of the hardware adapter device includes a plurality of protrusions on an outer surface of the housing;
the wiring baseboard includes a locking mechanism having a plurality of channels that fit in the plurality of protrusions on the outer surface of the housing; and
the locking mechanism secures the hardware adapter device to the wiring baseboard when the first PCB and the second PCB are coupled to the wiring baseboard.

12. A hardware adapter system, comprising:
a wiring baseboard;
a plurality of input/output (I/O) modules;
a controller operatively coupled to the wiring baseboard; and
a plurality of hardware adapter devices, wherein each hardware adapter device includes:
a first printed circuit board (PCB) housed by a housing, wherein the first PCB includes a first plurality of connection pins coupled to a plurality of receiving terminals of the wiring baseboard to electrically connect the first PCB to the wiring baseboard;
a second PCB housed by the housing and electrically connected to the first PCB, wherein the second PCB includes a second plurality of connection pins coupled to a different plurality of receiving terminals of the wiring baseboard to electrically connect the second PCB to the wiring baseboard;
a third PCB housed by the housing and electrically connected to the first PCB and the second PCB, wherein the third PCB includes receiving terminals configured to couple to a plurality of connection pins of an I/O module of the plurality of I/O modules to electrically connect the third PCB to the I/O module; and
a rotary switch to determine a bus address of the respective hardware adapter device.

13. The system of claim 12, wherein the rotary switch of each respective hardware adapter device defines a unique bus address for that respective hardware adapter device.

14. The system of claim 13, wherein the controller communicates with each I/O module of the plurality of I/O modules based on the uniquely defined bus address for each of the plurality of hardware adapter devices.

15. The system of claim 12, wherein the first PCB and the second PCB of each hardware adapter device are coupled to a unique plurality of receiving terminals of the wiring baseboard.

16. The system of claim 12, wherein the plurality of hardware adapter devices communicate signals between the controller and the wiring baseboard for use in a heating, ventilation, and air conditioning (HVAC) control system.

* * * * *